Nov. 8, 1966 M. N. GIULIANO ET AL 3,284,639

SEMICONDUCTOR SWITCH DEVICE OF CONTROLLED RECTIFIER TYPE
RESPONSIVE TO APPROXIMATELY EQUAL GATE SIGNALS
OF EITHER POLARITY

Filed Feb. 19, 1963

WITNESSES:

Bernard R. Gieguez

James F. Young

INVENTORS
Michael N. Giuliano and
Gene Strull.

BY Gordon H. Telfer

ATTORNEY 3,284,639

SEMICONDUCTOR SWITCH DEVICE OF CONTROLLED RECTIFIER TYPE RESPONSIVE TO APPROXIMATELY EQUAL GATE SIGNALS OF EITHER POLARITY

Michael N. Giuliano, Halethorpe, and Gene Strull, Pikesville, Md., assignors to Westinghouse Electric Corporation, Pittsburgh, Pa., a corporation of Pennsylvania Filed Feb. 19, 1963, Ser. No. 259,616
6 Claims. (Cl. 307—88.5)

This invention relates generally to semiconductor switch devices and, more particularly, to semiconductor controlled rectifier devices which exhibit bistable switching between a state of high resistance and a state of low resistance.

Semiconductor controlled rectifier devices generally comprise four successive regions of semiconductive material of alternate semiconductivity type. These regions are called the cathode-emitter (or the cathode), the first base, the second base and the anode-emitter (or the anode), respectively. Contacts are provided on the cathode, anode and first base region. The contact on the first base region is often referred to as the gate. The semiconductor controlled rectifier is characterized by the ability to withstand a relatively high voltage across the cathode and anode until a relatively small control signal is applied to the gate contact which produces switching to a hyperconductive state with a transition through a region of negative resistance.

The four layer controlled rectifier structure, such as an NPNP structure, is frequently analyzed in terms of two transistors, an NPN transistor and a PNP transistor, of which the base and collector regions of one transistor are common with the collector and base regions, respectively, of the other transistor, therefore making the collector junctions of the two transistors common. Switching occurs when the sum of the alphas, or emitter to collector amplification factors, of the two transistors is greater than unity. In conventional devices, one of the transistor portions is more responsive to the application of a signal to its base because it has a higher alpha. This is a result of the fabrication process employed in making the device since it is generally difficult to obtain a four layer structure in which the two three region transistor portions have similar characteristics and thus are each as readily susceptible to control by a signal applied to the base regions thereof. As a result, devices which are now available are NPNP type wherein the control signal is applied to the internal p-type region or PNPN type wherein the control signal is applied to the internal n-type region.

It would be desirable to have available a controlled rectifier which would be a universal device in the sense that it could be readily employed as the conventional NPNP device or the conventional PNPN device. Naturally, any such device must not only perform in the manner described but must be capable of being readily fabricated, that is, about as easily as existing devices.

It is, therefore, an object of the present invention to provide an improved semiconductor switching device.

Another object is to provide an improved semiconductor controlled rectifier capable of being utilized in the manner of conventional NPNP switches or conventional PNPN switches and is hence a universal switching element.

Another object is to provide an improved method for the fabrication of semiconductor switching devices of the controlled rectifier type.

The present invention, briefly and without defining its exact limits, provides a semiconductor switching device comprising five successive regions including, in sequence, a p-type region, an n-type region, a region which is so lightly doped with impurities of either type that relative to the other regions it may be said to be substantially intrinsic, a second p-type region, and a second n-type region. Terminals are provided on the outer regions and on the next adjacent inner regions.

The device may be operated with the outer p-type region serving as the anode and the outer n-type region serving as the cathode with switching produced by application of a control signal to the terminals on either of the internal regions.

The device is fabricated by starting with a semiconductor body which is lightly doped or substantially intrinsic and producing the impurity doped p- and n-type regions thereon, for example by diffusion operations. In this way the turn-on gain, or ability to increase the alphas to the switching point, of each transistor portion (a pnip portion and an npin portion) can be made substantially alike.

The present invention, both as to its organization and manner of operation, together with the above-mentioned and further objects and advantages thereof, may best be understood by reference to the following description, taken in connection with the accompanying drawings, in which.

Figure 1:
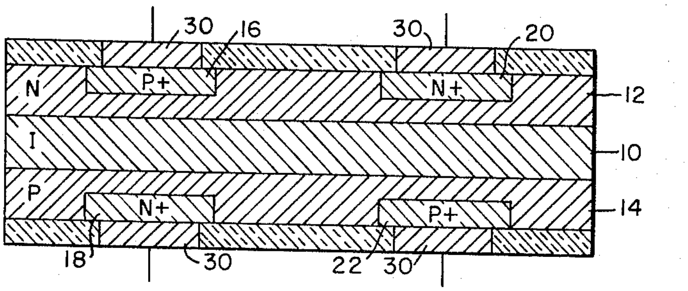
FIGURE 1 is a cross-sectional view of one embodiment of the device in accordance with the present invention.

Referring now to FIG. 1 there is shown a device in accordance with this invention comprising a lightly doped or substantially intrinsic region of semiconductive material disposed between a region 12 of n-type semiconductivity and a region 14 of p-type semiconductivity. The region 12 of n-type semiconductivity has thereon a region 16 of p-type semiconductivity and the p-type region 14 has thereon a region 18 of n-type semiconductivity.

The substantially intrinsic material of region 10 may be material which is not truly intrinsic but which exhibits low extrinsic semiconductivity relative to the other regions of the device. Therefore, it may be said that in general the lightly doped center region 10 should have a dopant concentration less than about $10^{14}$ atoms per cubic centimeter.

The n-type region 12 and the p-type region 14 adjacent the central lightly doped region 10 have substantially greater dopant concentration than that of the lightly doped region 10. For example, if formed by diffusion from a vapor, the n- and p-type regions 12 and 14 adjacent the intrinsic region may each be diffused to a surface concentration of their respective type which is of about $10^{14}$ to $10^{18}$ atoms per cubic centimeter. The outermost n-type and p-type regions 18 and 16 may each have greater impurity concentration such as from about $10^{18}$ to $10^{20}$ atoms per cubic centimeter and for that reason are designated as being of p+ and n+ types. The foregoing representative ranges of dopant concentration in the various regions of the device are intended merely to show the flexibility possible in the design of the device in accordance with this invention and are not intended to be limiting. The selection of specific concentration levels in the various regions is well within the scope of one skilled in the art.

The device of FIG. 1 has further n+ and p+ type regions 20 and 22 on the n- and p-type regions 12 and 14, respectively, for making ohmic contact thereto. Conductive contacts 30 and leads are applied to these regions 20 and 22 as well as to the p+ and n+ regions 16 and 18.

The device of FIG. 1 is significantly different from conventional controlled rectifiers in that it provides first and second base regions 12 and 14, the n- and p-type regions which are immediately adjacent the intrinsic region, which may be and preferably are fabricated in the same manner. It will be noted that in the conventional fabrication of controlled rectifiers, the starting material serves as the second base region and a diffused layer thereon serves as the first base region. Here, in contrast, the first and second base regions are each diffused regions on the starting material. This difference is significant because it pemits utilization of the device in either direction for switching, that is, with control signals applied to either of the base regions. There is a high degree of turn-on control whereby a relatively small signal applied to either region 12 or region 14 causes switching of the device to the hyperconductive state.

Figure 2:
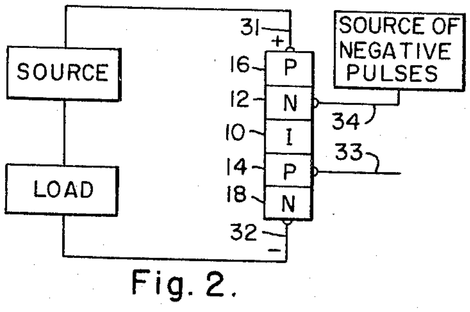
FIG. 2 is a circuit schematic of one manner of operating the device of FIG. 1.
Figure 3:
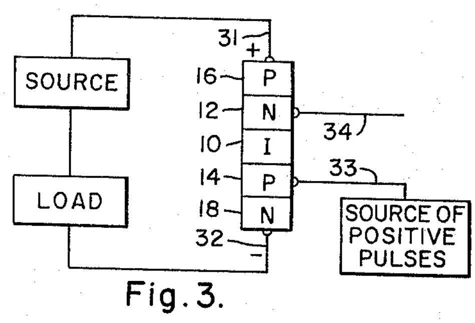
FIG. 3 is a circuit schematic of a second manner of operating the device of FIG. 1.
Figure 4:
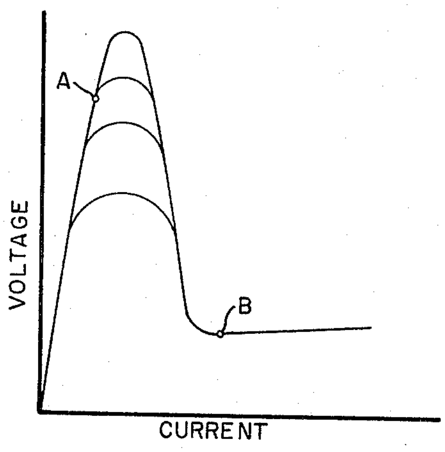
FIG. 4 is a voltage-current characteristic curve of a device in accordance with this invention.

With reference to FIGS. 2 and 3, the device of FIG. 1 is shown in schematic as a PNIPN structure with terminals 31 and 32 on the outer regions and terminals 33 and 34 on the next adjacent inner regions. A source and load are applied across the outermost regions in both embodiments. As in most controlled rectifier applications, the purpose is to selectively energize the load circuit by the application of signals to the semiconductor device. Without any signals applied to either of the base regions 12 or 14, the device is in the high resistance state, that is, somewhere between the origin and point A on the curve of FIG. 4, therefore little voltage is applied to the load. Upon application of a negative pulse by the source of negative pulses to the n-type base region 12, as shown in FIG. 2, it is possible to switch the device to the hyperconductive state, at point B on the curve. Upon application of a positive pulse by the source of positive pulses to the p-type base region 14, as shown in FIG. 3, it is also possible to switch the device to the hyperconductive state. It will be noted that devices in accordance with this invention are applicable in those switching circuits which presently employ any of the conventional three terminal controlled rectifiers, either NPNP or PNPN. The family of curves shown in FIG. 4 represents the characteristic for different magnitude of applied gate signal. While some variation in the characteristic may be expected for the two cases shown in FIGS. 2 and 3, it is not nearly as great as that encountered in conventional controlled rectifiers if control signals were applied to either base region.

Devices in accordance with the invention may be fabricated in a number of ways such as by the use of vapor diffusion to form the n- and p-type regions 12 and 14 within a substantially intrinsic starting material with the outer p- and n-type regions formed by alloy fusion, by diffusion alone, by epitaxial crystal growing techniques or combinations of these techniques.

Various geometrical configurations may be employed in accordance with existing knowledge that is applicable to controlled rectifier devices in general. For example, the relative location of the p-type region 16 and the n-type gate contact 20 on the upper surface may be of any of the various known configurations such as the gate contact being a center dot surrounded by an annularly shaped emitter region. The same or other configuration may be employed on the bottom surface.

Devices in accordance with this invention comprise the functions of two transistor portions: a first transistor portion which is PNIP type and includes the regions 16, 12, 10 and 14 and a second transistor portion which is NPIN type and includes the regions 18, 14, 10 and 12. Each transistor portion has similar electrical characteristics as to magnitude but they are of opposite polarity.

Hereinafter there will be described a specific embodiment of the present invention and its manner of fabrication in a semiconductive body of silicon. In addition to silicon, however, it will be recognized that other semiconductive materials such as germanium or a semiconductive compound, for example one comprising an element of Group III of the Periodic Table and an element of Group V of the Periodic Table, are suitable.

Referring again to FIG. 1, one method of fabrication of the device will be described with greater detail. This description is, of course, intended to be merely by way of example and not as defining the scope of the invention. A monocrystalline body of nu-type (lightly doped n-type) silicon is obtained having a substantially uniform concentration of about $10^{13}$ atoms per cubic centimeter. A thickness of not more than about four mils is suitable with a major surface diameter of about one half inch. The internal NIP structure may be formed by diffusion on opposite sides of the starting material with an n-type impurity and a p-type impurity. Known diffusion techniques may be employed for this purpose. For example, an n-type impurity may be diffused into one surface while the other surface is masked and then, with the n-type region masked, the other surface may be diffused with a p-type impurity.

It may be desirable to form the NIP structure by anodic oxidation of one side of the intrinsic wafer with a phosphorus containing oxide formed in accordance with known techniques. Diffusion is then carried out in a dilute boron atmosphere which will penetrate the opposite side of the starting material during which time the phosphorus will penetrate from the oxide and result in the NIP structure with only one heating operation. This may be followed by conventional diffusion through an oxide mask to form the n- and p-type regions 16, 18, 20 and 22 on both surfaces.

It will be noted that the structure of FIG. 1 includes an oxide layer extending over the exposed junctions with metallic ohmic contacts on the remaining portion of the exposed semiconductor. Naturally, oxide may also be disposed around the edges of the wafer. The resulting structure is therefore a planar structure with oxide passivated junctions.

While the present invention has been shown and described in certain forms only, it will be obvious to those skilled in the art that it is not so limited but is susceptible of various changes and modifications without departing from the spirit and scope thereof.

What is claimed is:

1. A semiconductor switch device comprising: at least five regions of semiconductive material including, in sequence, a first region of semiconductive material of a first type of conductivity, a second region of semiconductive material of a second type of conductivity, a third region of material which has a low dopant concentration so that it exhibits low extrinsic semiconductivity relative to the other regions of the device, a fourth region of semiconductive material of said first type of conductivity and a fifth region of semiconductive material of said second type conductivity; an electrically independent contact on each of said first, second, fourth and fifth regions; a load circuit connected between said contacts on said first and fifth regions and a source of switching pulses connected to one of said contacts on said second and fourth regions.

2. A semiconductor switch device in accordance with claim 1 wherein said first region and said fifth region have substantially similar dopant concentrations, said second region and said fourth region have substantially similar dopant concentrations at least about an order of magnitude less than that of said first and fifth regions and said third region has an average dopant concentration which is at least about an order of magnitude less than that of said second and fourth regions.

3. A semiconductor switch device which is suitable for application as either an NPNP switch or a PNPN switch and comprising: a PNIPN structure with successively adjacent P, N, I, P and N conductivity type regions with an electrically independent terminal on each of the P- and N-type regions said terminals on said outer P and N regions being connected across a load circuit and at least one of said terminals on said second and fourth regions being separately connected to a source of switching pulses so the device may be switched to the low resistance state by application of control signals to the terminals of either of the inner P and N regions.

4. A semiconductor switch device in accordance with claim 3 wherein the inner N- and P-type regions are responsive to control signals of like magnitude to switch the device into the on condition.

5. A semiconductor switch device comprising: a monocrystalline semiconductive body including, in sequence, first, second, third, fourth and fifth layers of semiconductive material of which said first and fourth layers are of a first type of conductivity, said second and fifth layers are of a second type of conductivity and said third layer is of substantially intrinsic semiconductive material to form the functional equivalent of a PNIP transistor and an NPIN transistor of which said second, third and fourth layers are common regions of each; an electrically independent ohmic contact on each of said first, second, fourth and fifth layers, said third layer being free of ohmic contacts; a load circuit connected between said contacts on said first and fifth regions and a source of switching pulses connected to one of said contacts on said second and fourth regions.

6. A semiconductor switch device in accordance with claim 5 wherein said first, second, third and fourth layers of said fifth, fourth, third and second regions provide respectively a PNIP transistor and an NPIN transistor having electrical characteristics of substantially like magnitude of opposite polarity.

References Cited by the Examiner

UNITED STATES PATENTS

| | | | |
|---|---|---|---|
| 2,983,854 | 5/1961 | Pearson | 317—234 |
| 3,159,780 | 12/1964 | Parks | 317—235 |

JOHN W. HUCKERT, *Primary Examiner.*

R. F. POLISSACK, *Assistant Examiner.*